United States Patent
Chen et al.

(10) Patent No.: US 7,115,214 B2
(45) Date of Patent: Oct. 3, 2006

(54) METHOD OF FORMING BARRIER LAYER

(75) Inventors: Ching-Hua Chen, Hsin-Chu (TW); Yi-Chung Cheng, Taipei Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/709,552

(22) Filed: May 13, 2004

(65) Prior Publication Data

US 2005/0103750 A1 May 19, 2005

(30) Foreign Application Priority Data

Nov. 18, 2003 (TW) ............... 92132299 A

(51) Int. Cl. *H01L 21/302* (2006.01)

(52) U.S. Cl. ............... 252/79.1; 257/E21.528; 438/98; 438/629; 438/639; 438/648; 438/690

(58) Field of Classification Search .......... 216/83; 438/685, 634

See application file for complete search history.

(56) References Cited

U.S. PATENT DOCUMENTS

| 5,338,975 | A | * | 8/1994 | Cole et al. ............... 257/750 |
| 5,885,900 | A | * | 3/1999 | Schwartz ............... 438/697 |
| 6,140,224 | A | * | 10/2000 | Lin ............... 438/634 |
| 6,297,065 | B1 | * | 10/2001 | Huang et al. ............... 438/14 |
| 6,368,410 | B1 | * | 4/2002 | Gorczyca et al. ............... 118/715 |
| 6,396,147 | B1 | * | 5/2002 | Adachi et al. ............... 257/758 |
| 6,613,614 | B1 | * | 9/2003 | Yamazaki et al. ............... 438/151 |

OTHER PUBLICATIONS

Kern; Handbook of Semiconductor Wafer Cleaning Technology—Science, Technology, and Applications; 1993; William Andrew Publishing/Noyes.*

Handbook of Semiconductor Wafer Cleaning Technology—Science, Technology, and Applications; Edited by kern, W.; Published 1993 by William Andrew Publishing/Noyes.*

* cited by examiner

Primary Examiner—Nadine Norton
Assistant Examiner—Patricia George
(74) Attorney, Agent, or Firm—Winston Hsu

(57) ABSTRACT

First, a substrate having at least a conducting layer is provided. Then, a CVD process is performed to form the Ti/TiN barrier layer onto the conducting layer. An examination procedure is followed, and if particles are detected in the Ti/TiN barrier layer, then a rework procedure is performed to remove the Ti/TiN barrier layer and to reform a new Ti/TiN barrier layer.

3 Claims, 7 Drawing Sheets

METHOD OF FORMING BARRIER LAYER

BACKGROUND OF INVENTION

1. Field of the Invention

The present invention relates to a method of forming a barrier layer, and more particularly, to a method, which includes an examination procedure and a rework procedure, to form the barrier layer effectively and economically.

2. Description of the Prior Art

Particles are nearly inevitable in semiconductor processes due to many reasons. These particles influence the electrical property of semiconductor elements formed in wafers. If the electrical property is not acceptable, an entire batch of wafers must be discarded. This indeed increases the production cost of semiconductor components. Normally, a wet etching process or a liquid type scrubber machine is adopted for removing the particles. However, these methods only remove the particles that adhere to the surface of the wafer. Once the particles are formed with the film during the deposition process or if the particles exist on the surface of the film formed previously, these methods fail to get rid of the particles. This seriously affects the yield of semiconductor processes.

In addition, as the critical dimension reduces while the component integrity improves in semiconductor processes, physical vapor deposition (PVD) technologies, such as evaporation or sputtering, are no longer available to fulfill the requirements of the modern semiconductor processes, especially when the critical dimension is less or the aspect ratio is higher. Therefore, for obtaining a better step coverage, the chemical vapor deposition (CVD) technology is normally adopted to form a thin film with a better shape.

Though a film with better step coverage is easy to be obtained by CVD technology, particles tend to occur in the film made by CVD process due to some inevitable reasons, such as gas phase nucleation phenomenon or peelings from the inner walls of reactor. For illustrating the cause of particles and their influence to the electrical property of the barrier layer, a conventional deposition process of forming a barrier layer is shown as an example here.

Please refer to FIG. 1 and FIG. 2. FIG. 1 and FIG. 2 are schematic diagrams illustrating a conventional method of forming a barrier layer. As shown in FIG. 1, first a substrate 10 having at least a stacked gate structure 12 thereon is provided. The stacked gate structure 12 has a spacer 14 disposed along the sidewalls of the stacked gate structure 12. The substrate 10 further includes a drain doped region 16 and the source doped region 18 on both sides of the stacked gate structure 12. Then a dielectric layer 20 is formed on the substrate 10, and a photoresist pattern (not shown) is employed as a hard mask to remove a portion of the dielectric layer 20 positioned on the drain doped region 16 for forming a plug hole 22.

As shown in FIG. 2, a CVD process is performed to form a barrier layer 24 on the inner walls of the plug hole 22. The barrier layer 24 is generally composed of Ti/TiN for enhancing the ohmic contact ability toward a bit line plug (not shown), which will be formed later. In addition, the barrier layer 24 is able to restrain metal atoms from diffusing. As described earlier, as long as the particles fall from the inner walls of the reactor or the gas phase nucleation phenomenon happens in the CVD process, particles 26 appear on the surface of the barrier layer 24.

Normally, an electrical property examination procedure is executed after interconnect processes. Those semiconductor components that fail to pass the examination procedure always include more particles than other wafers. Since those semiconductor components are not serviceable, to discard them seems to be the only solution. This seriously affects the production yield. Therefore, how to reduce the damage of particles is a key topic for study in the semiconductor industry.

SUMMARY OF INVENTION

It is therefore a primary objective of the present invention to provide a method of forming a barrier layer, which comprises an examination procedure and a rework procedure, for improving production yield.

According to the claimed invention, a method of forming a barrier layer is disclosed. The method comprises providing a substrate having at least a conducting layer, performing a CVD process to form a barrier layer onto the conducting layer, and performing an examination procedure. If particles are detected in the barrier layer, then a rework procedure is performed. The rework procedure comprises performing an etching process to remove the barrier layer that was originally formed, then scrubbing the substrate with a scrubber machine, rinsing the surface of the substrate with a cleaning solution, and performing another CVD process to form a new barrier layer onto the surface of the conducting layer.

It is an advantage of the present invention that an examination procedure is executed after the barrier layer is formed. As long as particles are detected, the original barrier layer is removed and another barrier layer is then formed on the conducting layer. Instead of discarding the semiconductor components having poor electrical property, a new barrier layer is reformed onto the conducting layer. Consequently, the yield is effectively improved.

These and other objects of the present invention will be apparent to those of ordinary skill in the art after having read the following detailed description of the preferred embodiment that is illustrated in the various figures and drawings.

DETAILED DESCRIPTION

Figure 1:
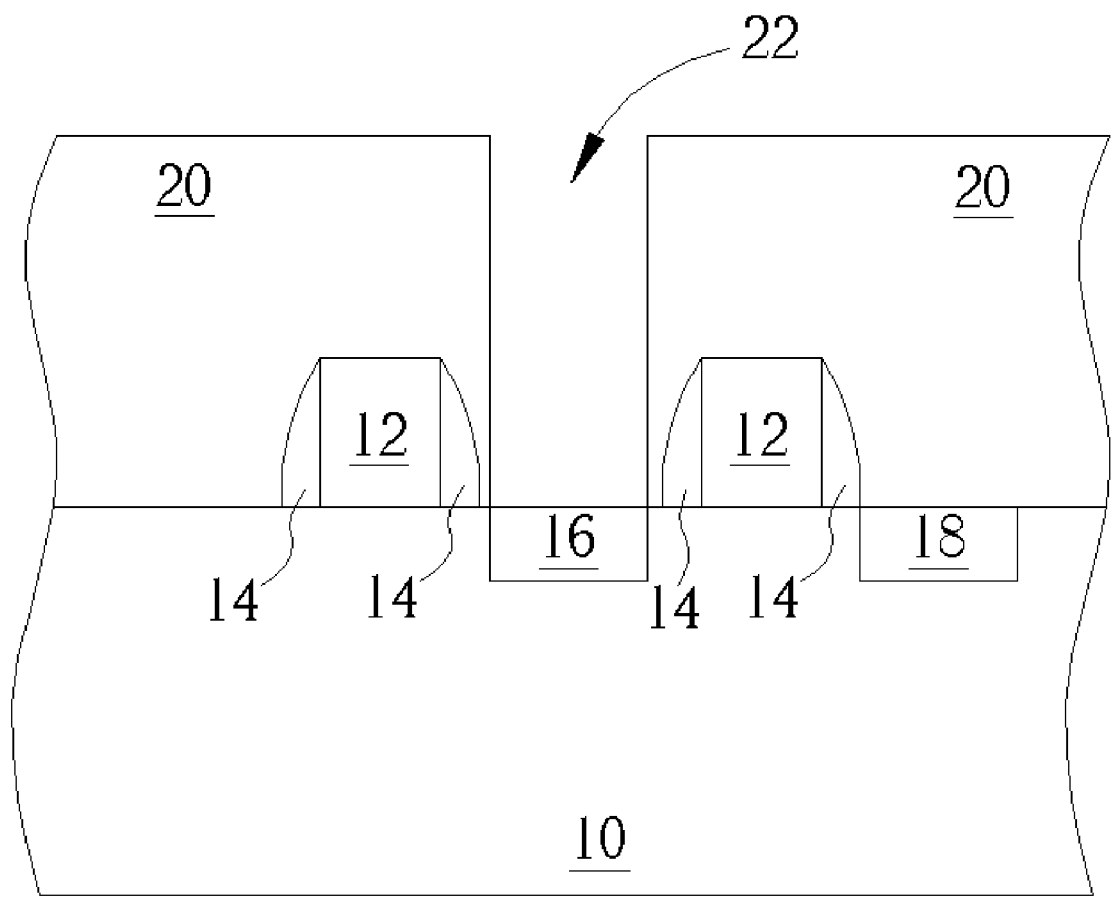
FIG. 1 and FIG. 2 are schematic diagrams illustrating a conventional method of forming a barrier layer.
Figure 2:
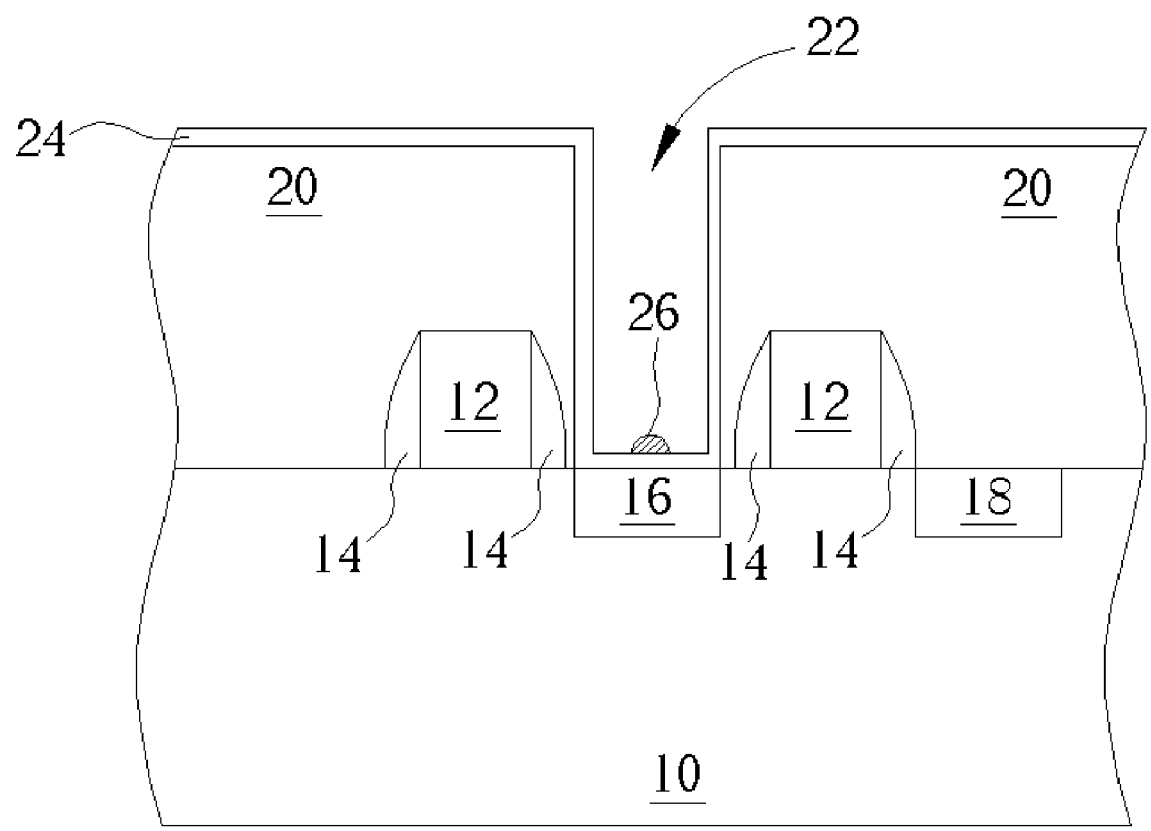
Figure 3:
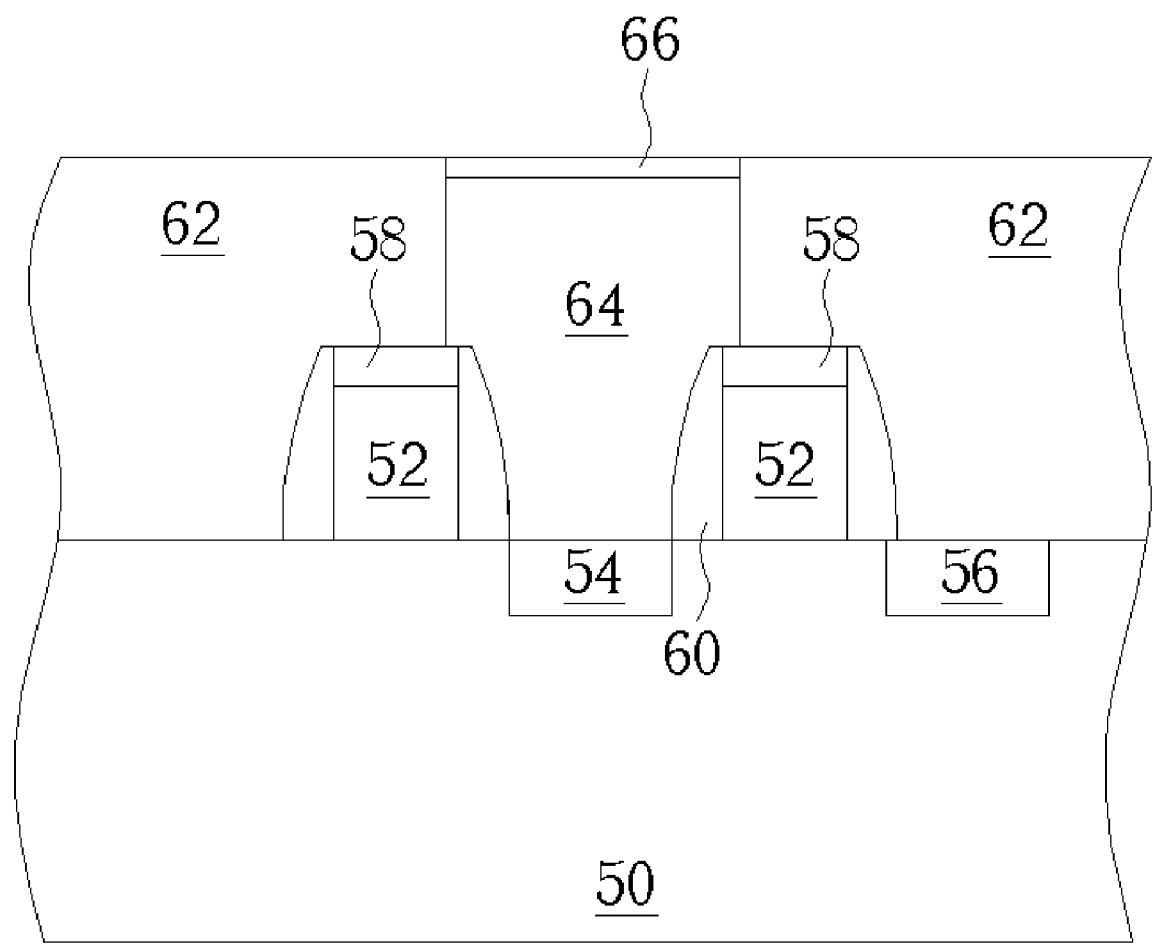
FIG. 3 to FIG. 6 are schematic diagrams illustrating a method of forming a barrier layer according to a preferred embodiment of the present invention.

For clearly demonstrating the present invention, a barrier layer process followed by a bit line plug process is taken as an example herein. Please refer to FIG. 3 to FIG. 6, which are schematic diagrams of forming a barrier layer according to a preferred embodiment of the present invention. As shown in FIG. 3, first a substrate 50 having at least a stacked gate structure 52 thereon is provided. Each stacked gate structure 52 is accompanied by a drain doped region 54 and a source doped region 56 in the substrate 50 alongside. In addition, each stacked gate structure 52 includes a cap layer 58 on the top, and a spacer 60 disposed along the sidewalls of the stacked gate structure 52. The cap layer 58, generally composed of silicon nitride, is provided for preventing a short circuit problem during following processes.

Then, a dielectric layer 62 is formed onto the substrate 50. A photoresist pattern (not shown), functioning as a hard mask, is formed onto the dielectric layer 62 to remove a portion of the dielectric layer 62 for forming a contact hole (not shown). Following that, a polysilicon layer 64 is deposited into the contact hole (not shown), and a silicide layer 66 is formed in the surface of the polysilicon layer 64. The polysilicon layer 64 serves as a landing pad, while the silicide layer 66 is provided for improving the conductivity between the polysilicon layer 64 and a barrier layer that will be formed later. For example, in this embodiment cobalt (Co) or cobaltic compounds are used to react with the polysilicon layer 64 for forming cobalt silicide (CoSi) as the silicide layer 66.

Figure 4:
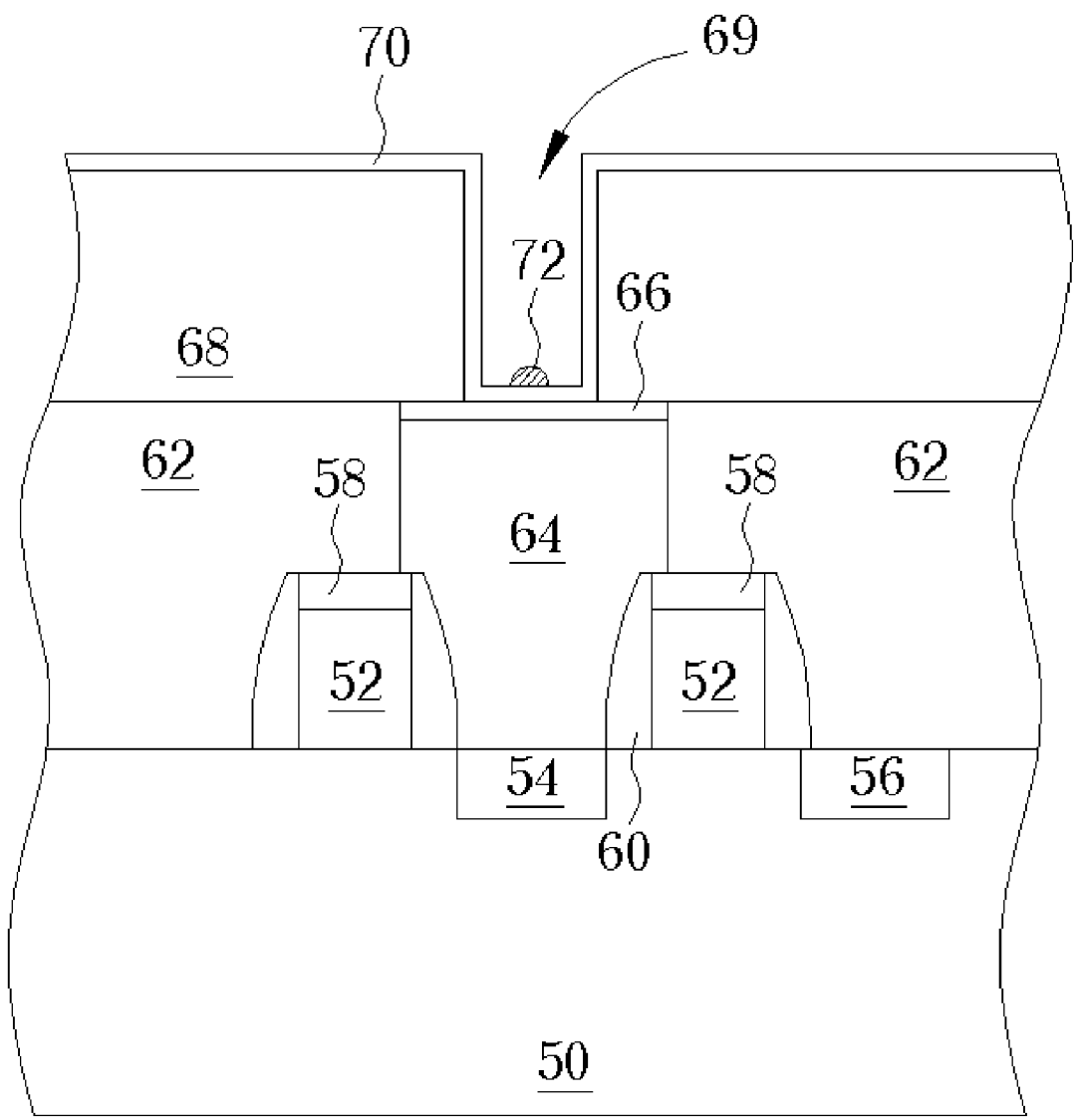

As shown in FIG. 4, another dielectric layer 68 is deposited onto the dielectric layer 62 and the silicide layer 66. Then a photoresist pattern (not shown), which functions as a hard mask, is formed on the dielectric layer 68 to remove a portion of the dielectric layer 68 for forming a plug hole 69, and the photoresist pattern (not shown) is removed shortly thereafter. Following that, a CVD process is performed to form a Ti/TiN film 70, which serves as a barrier layer, onto the surface of the silicide layer 66 and the dielectric layer 68. The method of forming the Ti/TiN film 70 includes the following steps. First, a Ti film (not shown) is formed onto the surface of the silicide layer 66 and the dielectric layer 68 by reacting $TiCl_4$ and hydrogen ($H_2$) in high temperature. Then $NH_3$ gas is introduced to react with the Ti film (not shown) in high temperature to form a TiN film (not shown). As described, once large particles appear, the electrical property of semiconductor components will be deeply influenced. As a result, an examination procedure is executed with an electron microscope to detect whether the Ti/TiN film 70 contains too many or too large particles 72, and to contrast with a database for judging if the particles 72 deteriorate the electrical property. If the particles 72 are critical, then a rework procedure is performed to remove the Ti/TiN film 70 and the particles 72, and to reform another Ti/TiN film (not shown).

The rework procedure begins by a wet etching process, and the particles 72 and the Ti/TiN film 70 are removed in the wet etching process. In a preferred embodiment of the present invention, an etching solution composed of phosphoric acid ($H_3PO_4$), nitric acid ($HNO_3$), acetic acid ($CH_3COOH$), and water ($H_2O$) is used to remove the particles (not shown) and the Ti/TiN film (not shown). The preferred ratio of phosphoric acid, nitric acid, acetic acid, and water is (38–41):(1–1.5):(1.8–2.1):(2.8–3.2), and the most preferable ratio of phosphoric acid, nitric acid, acetic acid, and water is 40:1:2:3. During the wet etching process, it takes about 1400 to 2000 seconds to completely remove the particles 72 and the Ti/TiN film 70. A scrubbing process is then performed by a scrubber machine (not shown) to remove remnant particles 72 on the surface of the silicide layer 66 and the dielectric layer 68. Following that, a sulfuric solution is used to rinse the surface of the silicide layer 66 and the dielectric layer 68 for further removing remnant particles 72.

Figure 5:
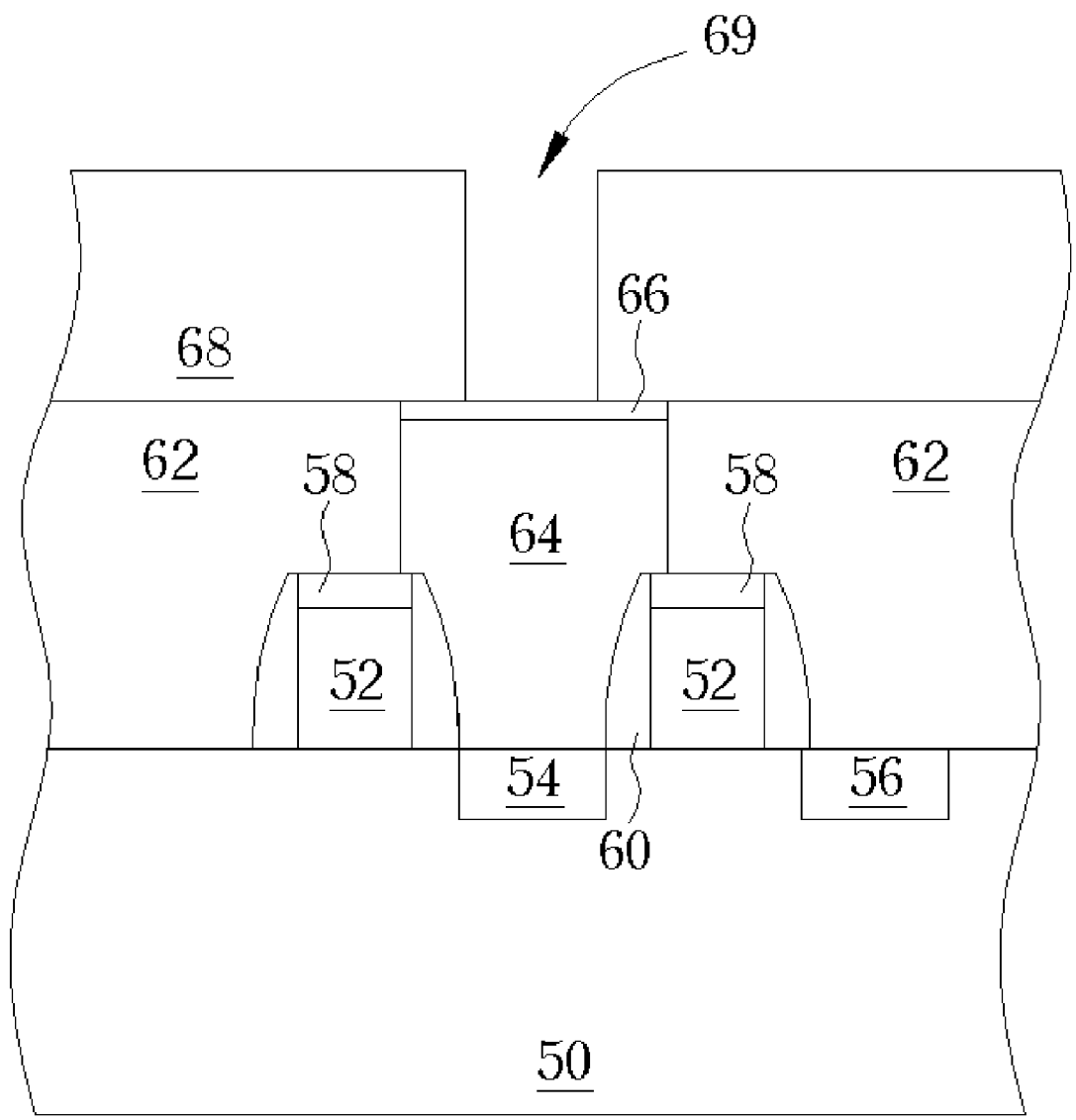

As shown in FIG. 5, another CVD process is carried out for forming another Ti/TiN film 74 onto the surface of the silicide layer 66 and the dielectric layer 68. As long as the new Ti/TiN film 74 is formed and succeeds in passing the examination procedure, following processes for forming the bit line plug will be implemented.

Figure 6:
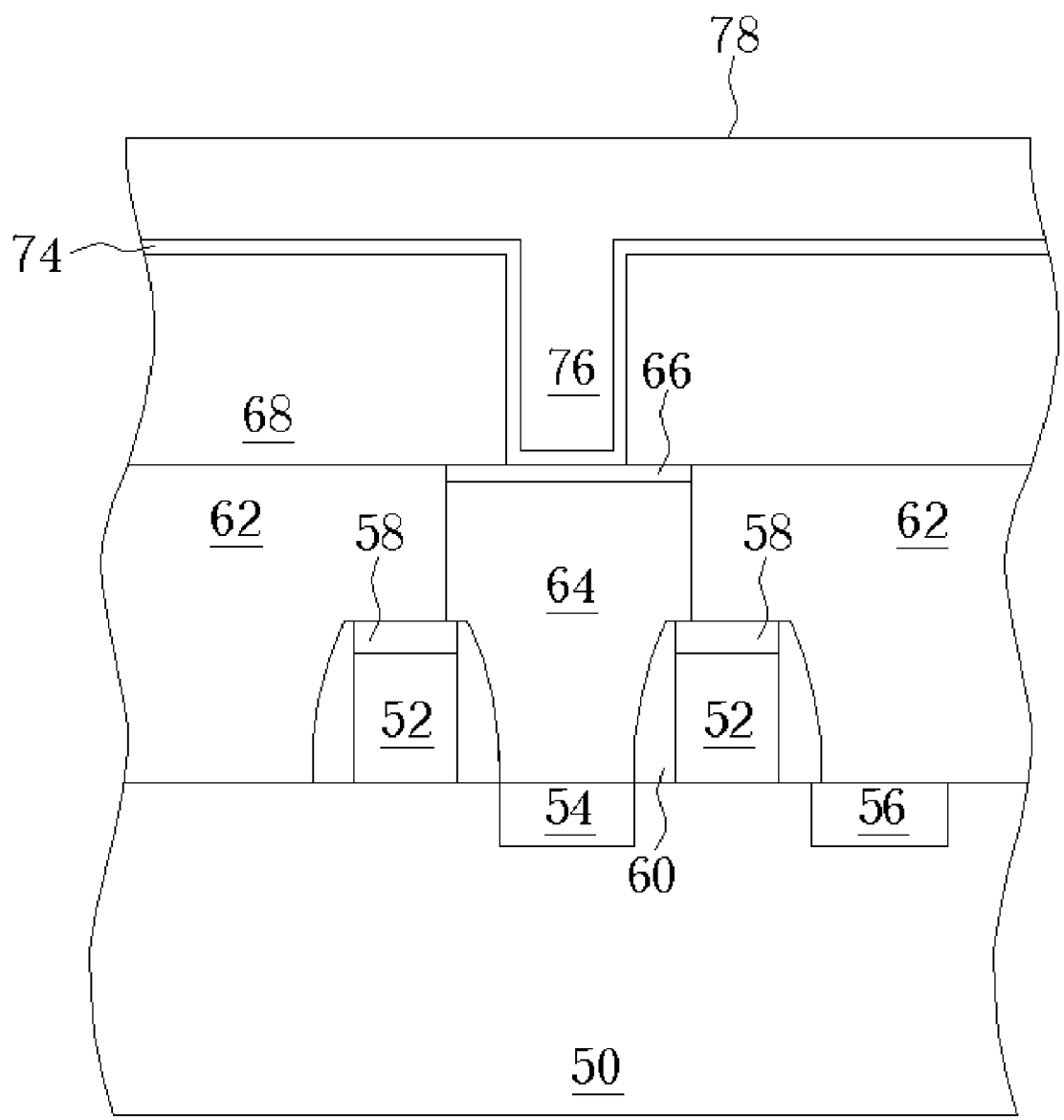

As shown in FIG. 6, a first metal layer (not shown) is deposited onto the Ti/TiN film 74 to fill in the plug hole 69 (refer to FIG. 5). Then a planarization process is performed to form a bit line plug 76. Afterward, a second metal layer (not shown) is deposited and a photoresist pattern (not shown) is used to remove a portion of the second metal layer (not shown) for forming a bit line 78. It is worth noticing that the bit line plug 76 and the bit line 78 can be formed simultaneously by performing an etching process if the bit line plug 76 and the bit line 78 comprise the same metal. In this embodiment, tungsten is the material of the bit line contact 76 and the bit line 78. However, other materials, such as polysilicon, can also be applied according to the electrical property requirement.

Figure 7:
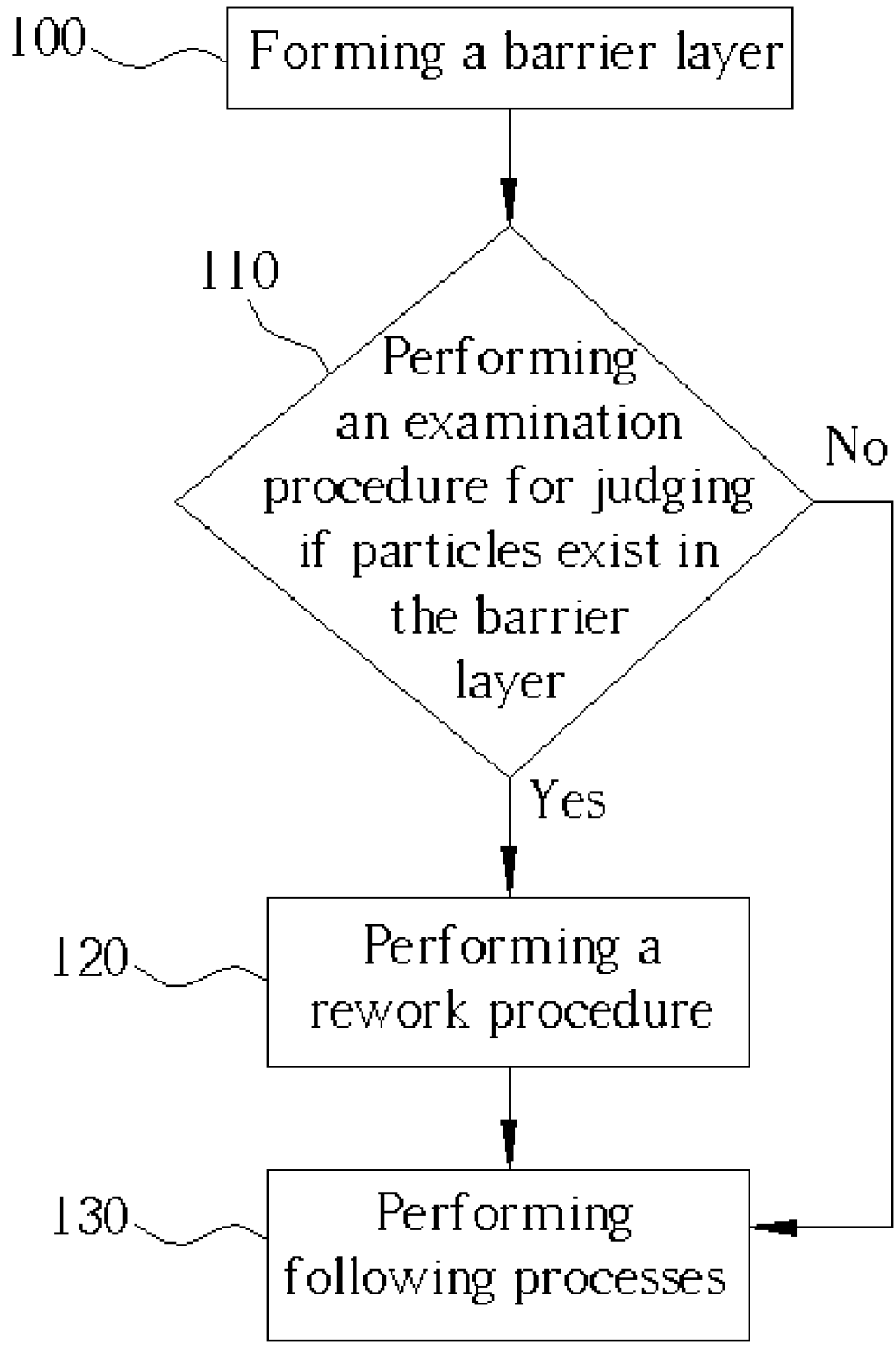
FIG. 7 is a flow chart of a method of forming a barrier layer according to the present invention.

In summary, the present invention performs an examination procedure after the barrier layer is formed. Once critical particles, that deteriorate the electrical property, are detected, a rework procedure is performed to reform another barrier layer. Please refer to FIG. 7. FIG. 7 is a flow chart of a method for forming a barrier layer according to the present invention. As shown in FIG. 7, the method includes following steps: 100: forming a barrier layer onto the surface of the substrate; 110: performing an examination procedure, and then execute step 120 if the barrier layer includes particles that influence the electrical property, otherwise execute step 130;120: performing a rework procedure to remove the barrier layer and to reform another barrier layer; and 130: performing the following processes for forming the bit line plug.

Experimental results show that the number of the particles of the new barrier layer is dramatically reduced. Consequently, the rework procedure of the present invention is useful to improve the yield. It is worth noticing that the present invention is not limited to form the Ti/TiN film that serves as an interface between the landing pad and the bit line plug. The present invention can apply to the barrier layer with different materials, such as tungsten silicon, or any other barrier layer processes that require higher electrical property, such as a metal contact process, an interconnect process, and a dual damascene process. On condition that the conducting layer (a polysilicon layer, a metal layer, or a silicide layer) is not damaged, the rework procedure can be performed to form a new barrier layer onto the conducting layer.

In contrast with the prior art, the present invention performs an examination procedure to detect if particles exist in the barrier layer, and executes a rework procedure to reform a new barrier layer. In such case, the barrier layer has better conductivity and the yield is improved.

Those skilled in the art will readily appreciate that numerous modifications and alterations of the device may be made without departing from the scope of the present invention. Accordingly, the above disclosure should be construed as limited only by the metes and bounds of the appended claims.

What is claimed is:

1. A method of forming a barrier layer comprising:
   (a) providing a substrate having a cobalt silicide and a plug hole exposing the cobalt silicide;
   (b) performing a chemical vapor deposition (CVD) process for forming a Ti/TiN film, functioning as the barrier layer, onto the cobalt silicide and inner walls of the plug hole;
   (c) performing an examination procedure, and if particles are detected in the barrier layer, then performing step (d); and
   (d) performing a rework procedure comprising:
      performing a wet etching process to remove the barrier layer, the wet etching process being implemented with an acid solution comprising phosphoric acid ($H_3PO_4$), nitric acid ($HNO_3$), acetic acid ($CH_3COOH$), and water ($H_2O$), wherein the ratio of phosphoric acid, nitric acid, acetic acid, and water in the acid solution is between (38–41):(1–1.5):(1.8–2.1):(2.8–3.2); scrubbing the substrate with a scrubber machine for removing the particles;

rinsing the substrate with a cleaning solution; and performing another CVD process for forming another Ti/TiN film onto the cobalt silicide and the inner walls of the plug hole.

2. The method of claim 1 wherein the cleaning solution is a sulfuric acid ($H_2SO_4$) solution.

3. The method of claim 1 wherein the examination procedure is performed for detecting the particles that influence electrical property.

* * * * *